(12) United States Patent
Lim et al.

(10) Patent No.: US 8,403,510 B2
(45) Date of Patent: Mar. 26, 2013

(54) LOW HEIGHT DISPLAY USING MULTILAYER PRINTED CIRCUIT BOARD WITH A LAMINATED PANEL AS HOUSING

(75) Inventors: Seong Choon Lim, Penang (MY); Meng Ee Lee, Penang (MY); Yam Khoon Boo, Penang (MY)

(73) Assignee: Intellectual Discovery Co., Ltd., Seoul (KR)

( * ) Notice: Subject to any disclaimer, the term of this patent is extended or adjusted under 35 U.S.C. 154(b) by 280 days.

(21) Appl. No.: 13/048,684

(22) Filed: Mar. 15, 2011

(65) Prior Publication Data
US 2012/0236531 A1 Sep. 20, 2012

(51) Int. Cl.
*F21V 9/16* (2006.01)
(52) U.S. Cl. ......................................... 362/84
(58) Field of Classification Search .................. 362/84
See application file for complete search history.

(56) References Cited

U.S. PATENT DOCUMENTS

| | | | |
|---|---|---|---|
| 5,833,903 A | 11/1998 | Centofante | |
| 6,023,414 A | 2/2000 | Fujii | |
| 6,355,125 B1 | 3/2002 | Tahon et al. | |
| 6,540,377 B1 | 4/2003 | Ota et al. | |
| 7,375,381 B2 * | 5/2008 | Shimizu et al. | 257/98 |
| 2006/0006791 A1 | 1/2006 | Chia et al. | |
| 2008/0013320 A1 * | 1/2008 | Tain et al. | 362/294 |
| 2010/0155769 A1 * | 6/2010 | Lin et al. | 257/99 |

* cited by examiner

*Primary Examiner* — Evan Dzierzynski
(74) *Attorney, Agent, or Firm* — Fox Rothschild LLP

(57) ABSTRACT

A multi-segment display is disclosed. Specifically, a low height LED-based display is disclosed that includes a number of segments. The segment construction may include a Printed Circuit Board (PCB) layer, a first substrate, and a second substrate that are laminated or otherwise connected to one another. The first and second substrates may include windows which allow light generated by a light source mounted on the PCB to exit the display and one or more of the windows may be filled with an encapsulant.

20 Claims, 9 Drawing Sheets

LOW HEIGHT DISPLAY USING MULTILAYER PRINTED CIRCUIT BOARD WITH A LAMINATED PANEL AS HOUSING

FIELD OF THE DISCLOSURE

The present disclosure is generally directed toward light emitting devices and package configures for the same.

BACKGROUND

Light Emitting Diodes (LEDs) have many advantages over conventional light sources, such as incandescent, halogen and fluorescent lamps. These advantages include longer operating life, lower power consumption, and smaller size. Consequently, conventional light sources are increasingly being replaced with LEDs in traditional lighting applications. As an example, LEDs are currently being used in flashlights, camera flashes, traffic signal lights, automotive taillights and display devices.

One area of application for LEDs is in seven segment displays. A problem with currently available LED-based seven segment displays is height. Specifically, there are no seven segment displays available in the market today that have a product height of 3 mm or less. An example of a traditional LED segment 100 used in a seven segment display is depicted in FIG. 1. The LED segment 100 of the prior art traditionally includes a plastic housing 104 fastened to a Printed Circuit Board (PCB) substrate 108 via one or more housing seats.

The completed segment 100 also typically comprises a light source 120 located in a cavity of the housing 104, one or more bonding wires 124 connecting the light source 120 to an electrical lead on the PCB substrate 108, a protective encapsulant 128 that protects the light source 120 and bonding wires 124 from ambient moisture, and a conditioning encapsulant 132 that is used for conditioning light generated by the light source 120 before it exits the segment 100.

In some embodiments, the housing 104 of a segment 100 is fastened to the PCB substrate 108 via a first housing seat 112a and a second housing seat 112b. The housing seats 112a, 112b are usually formed by a process where pegs of the housing 104 are inserted through holes in the PCB substrate 104 and then the pegs are subjected to a combination of heat and pressure until the ends of the pegs mushroom outwardly (i.e., become larger in area than the holes of the PCB substrate 104) and secure the housing 104 to the PCB substrate 108.

This practice of establishing housing seats 112a, 112b to secure the housing 104 to the PCT substrate 108 is generally acceptable in the industry today. However, it can have drawbacks. In particular, the pressure and/or heat applied to the segment 100 to form the housing seats 112a, 112b places a limitation on the thickness of the housing 104 and PCB substrate 108. If the housing 104 or PCB substrate 108 are too thin (e.g., less than 3 mm collectively), then the pressure and/or heat may cause faults in the housing 104 or PCB substrate 108.

Another drawback to using the segment 100 construction depicted in FIG. 1 is that an air gap 116 is created between the housing 104 and PCB substrate 108 when the housing seats 112a, 112b are established. The air gap 116 is generally not very large, but does necessitate the protective encapsulant 128 to protect the light source 120. Without the protective encapsulant 128, ambient moisture would be allowed to reach the light source 120 via the air gap 116 and could potentially damage the light source 120.

BRIEF DESCRIPTION OF THE DRAWINGS

The present disclosure is described in conjunction with the appended figures.

DETAILED DESCRIPTION

The ensuing description provides embodiments only, and is not intended to limit the scope, applicability, or configuration of the claims. Rather, the ensuing description will provide those skilled in the art with an enabling description for implementing the described embodiments. It being understood that various changes may be made in the function and arrangement of elements without departing from the spirit and scope of the appended claims.

Furthermore, although one particular type of display is depicted and described herein, embodiments of the present disclosure are not so limited. Specifically, embodiments of the present disclosure can be utilized in any type of display and are not necessarily limited to seven segment displays or LED-based displays. Rather, displays having one, two, three, four, five, six, eight, nine, etc. segments may incorporate elements of the display discussed herein. Also, any type of display, whether utilizing an LED light source or not, may utilize elements of the display discussed herein.

Figure 1:
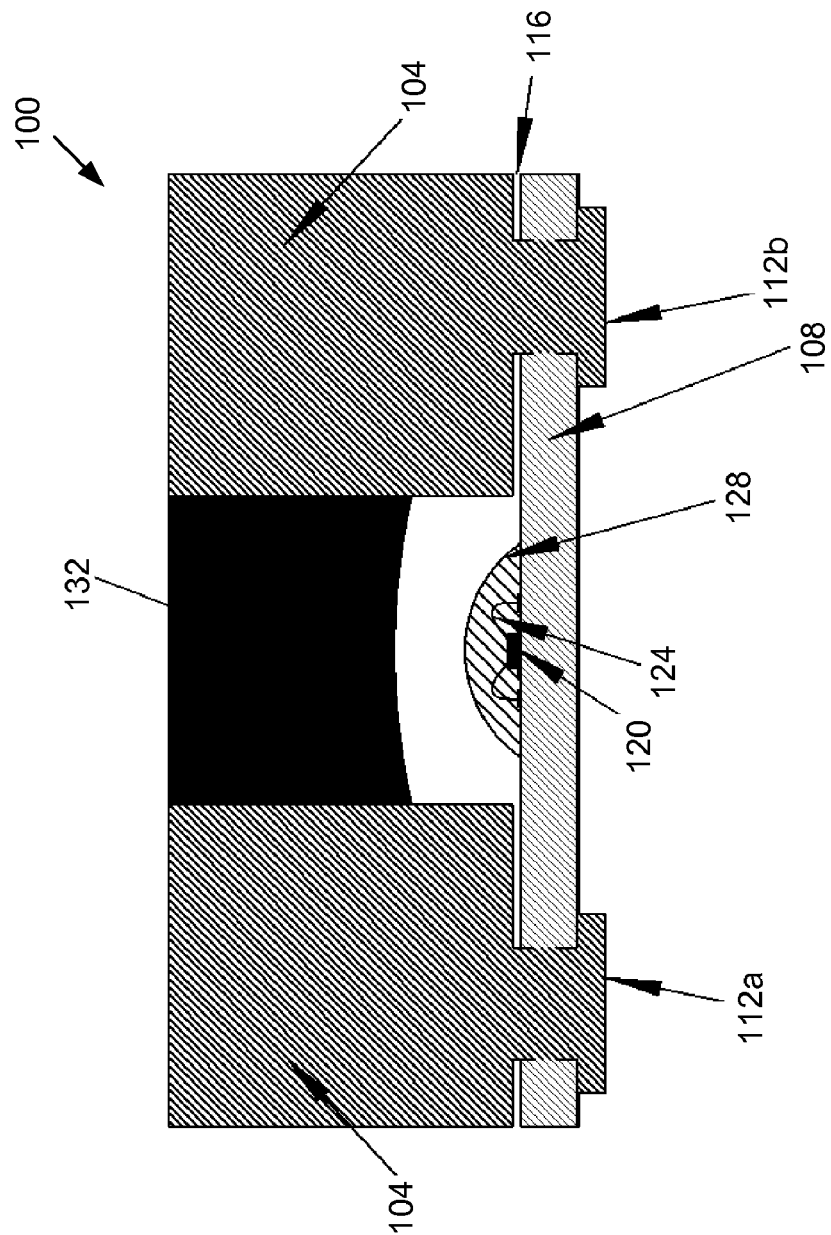
FIG. 1 is a cross-sectional view of an LED segment according to embodiments of the prior art.
Figure 2A:
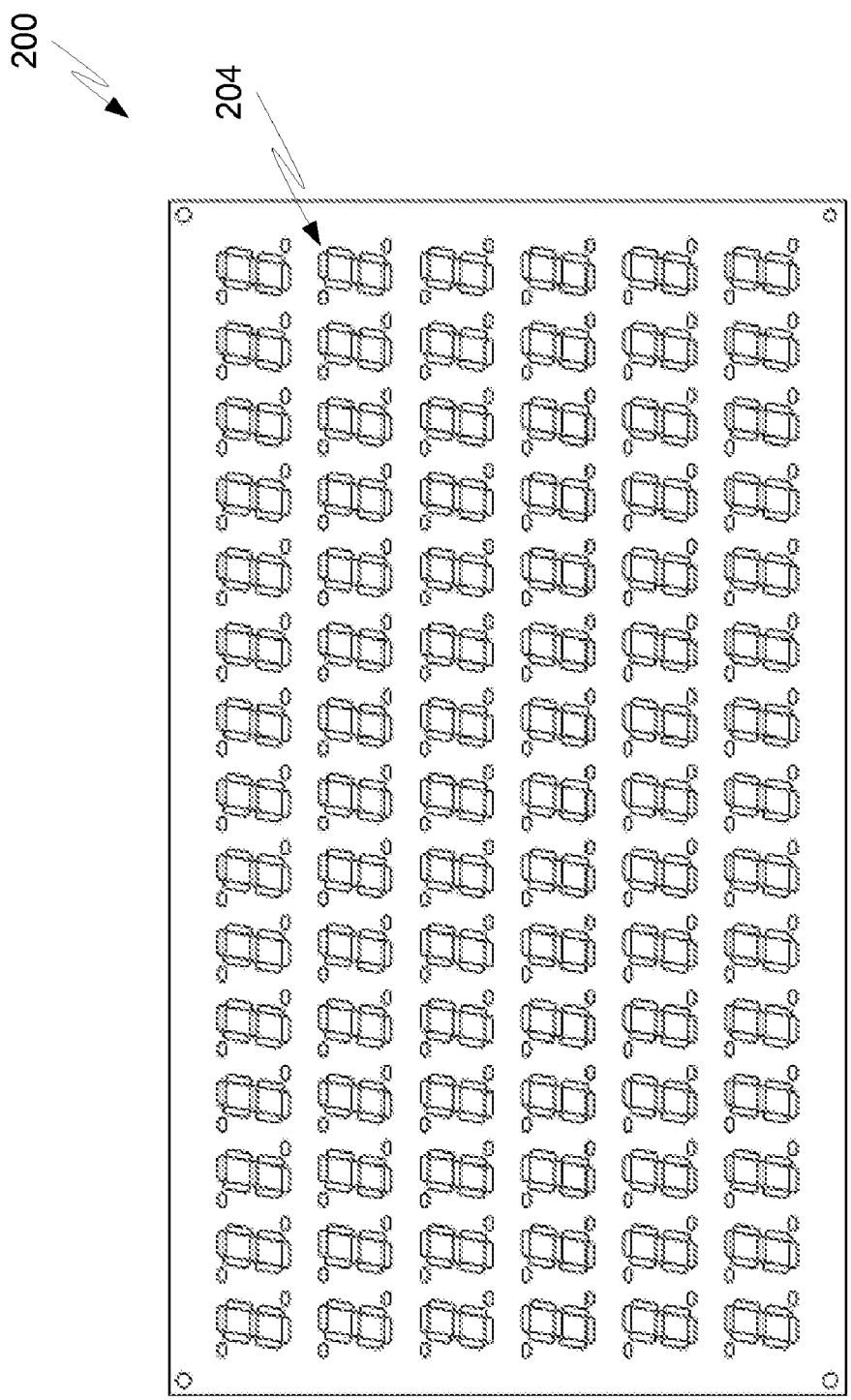
FIG. 2A is a top view of a display panel in accordance with embodiments of the present disclosure.

Referring initially to FIG. 2A, a panel 200 including a plurality of displays 204 is depicted. The panel 200 is constructed of a plurality of layers as will be described in further detail herein. The plurality of displays 204 may be simultaneously manufactured on the panel 200. In some embodiments, up to 90 units of displays 204 may be manufactured on a single panel 200. As can be appreciated, a greater or lesser number of displays 204 may be provided on a single panel 200 without departing from the scope of the present disclosure. Specifically, more (or less) than 90 units of displays 204 may be manufactured on a single panel 200 simultaneously.

The multi-layer construction of the displays 204 enables the plurality of displays to be simultaneously produced on the panel 200 rather than requiring a single display construction as was required under the prior art manufacturing processes. This greatly increases the efficiency with which the displays 204 can be manufactured and allows a higher production throughput.

Figure 2B:
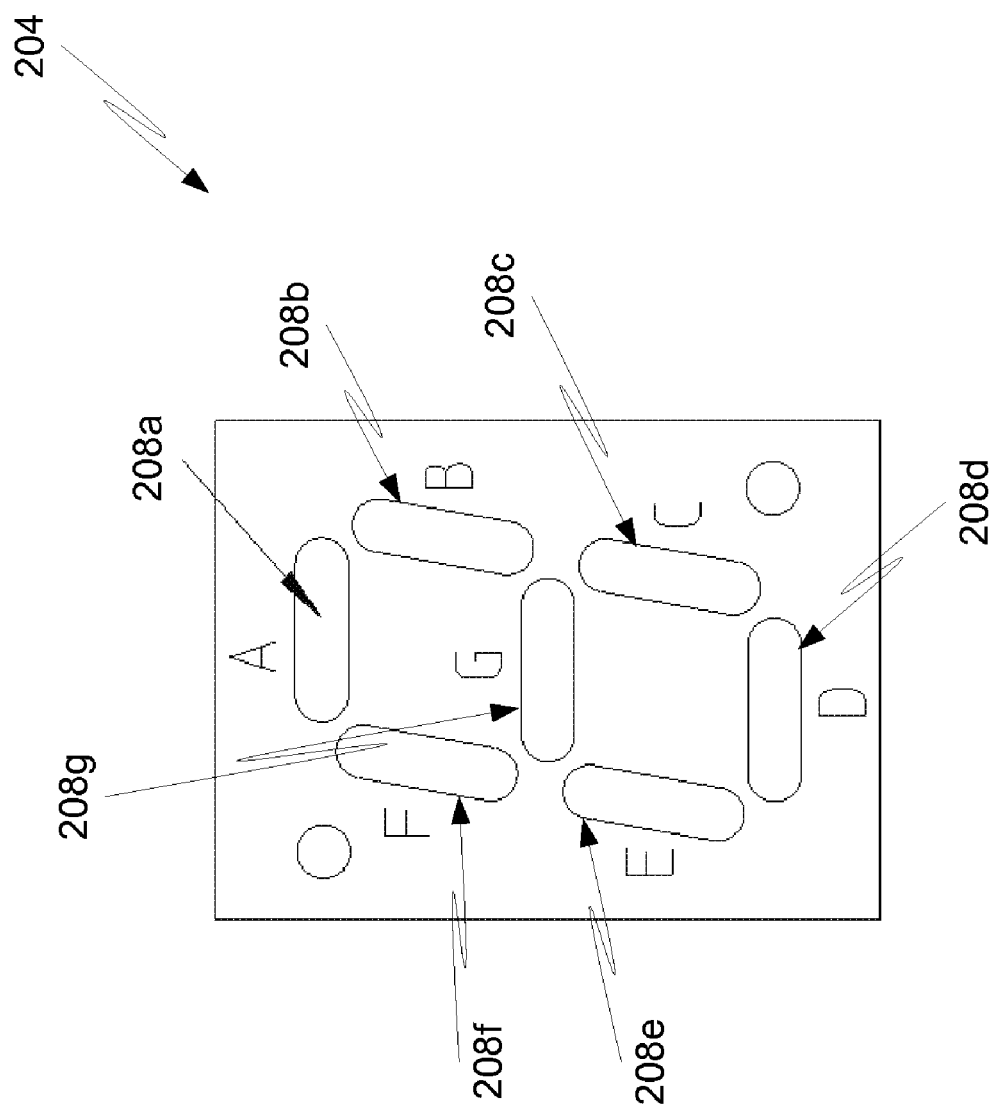
FIG. 2B is a top view of a seven segment display in accordance with embodiments of the present disclosure.

FIG. 2B shows a closer view of a single display 204. The display 204 may comprise a plurality of segments 208*a-f*. Although the display 204 depicted in FIG. 2B is a seven segment display, one of ordinary skill in the art will appreciate that embodiments of the present disclosure are not so limited. In a traditional seven segment display, the segments 208*a-d* have a specific orientation to facilitate the depiction of any numerical value from 0-9 and certain letters. Of course, other segment orientations such as starburst, for example, may be utilized to display all letters in the English language. Of course, a display 204 having other types of segment orientations may be used to depict characters or letters of non-English languages.

Figure 3:
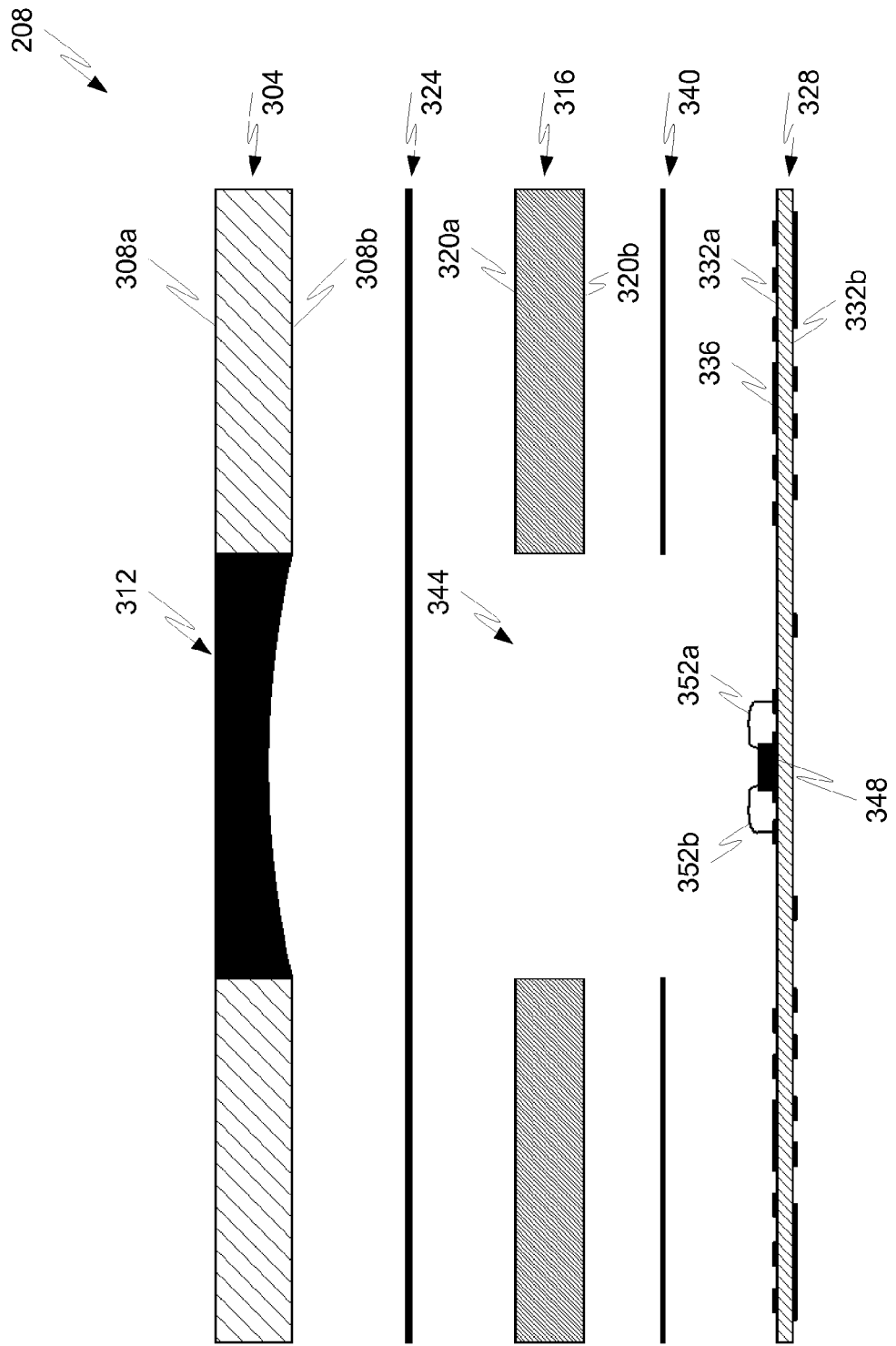
FIG. 3 is a cross-sectional exploded view of a display segment in accordance with embodiments of the present disclosure.
Figure 4:
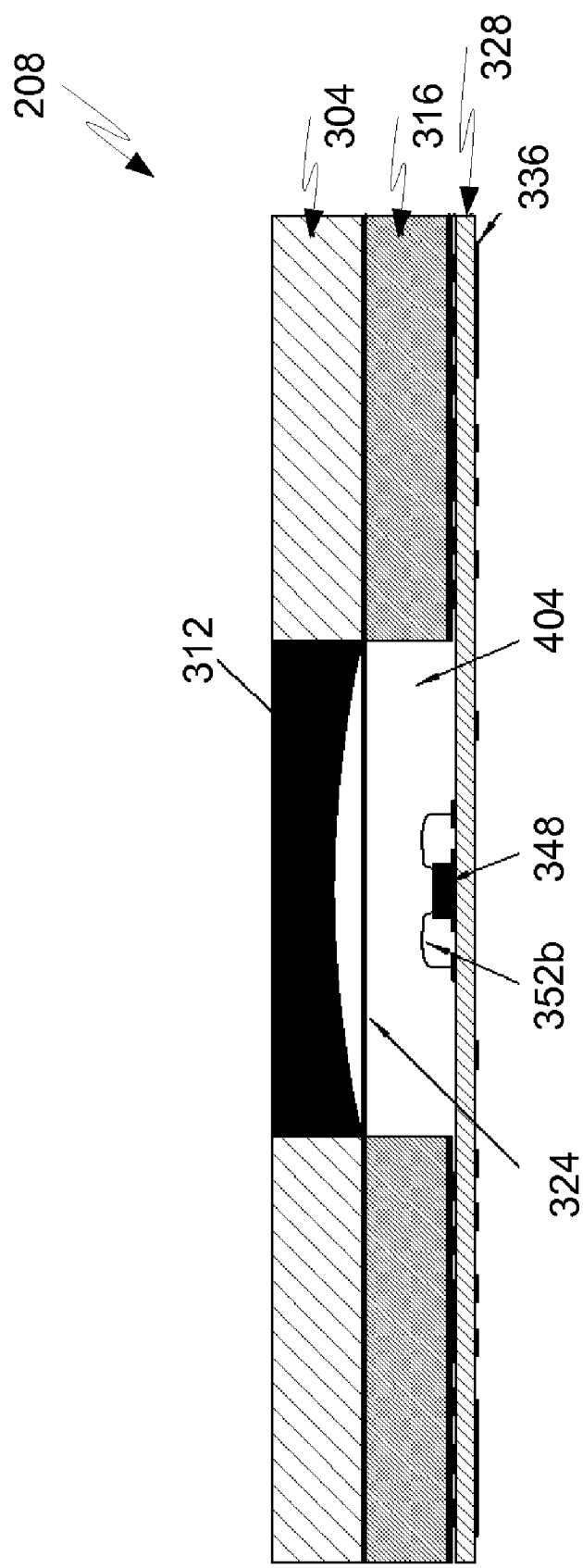
FIG. 4 is a cross-sectional view of a first display segment configuration in accordance with embodiments of the present disclosure.

FIGS. 3 and 4 depict one possible configuration of a segment 208. As can be appreciated, although the configuration of a single segment 208 will be described in detail, each of the segments 208*a-d* may have similar or identical configurations to the single segment 208 described herein. More broadly, segments of multiple displays 204 on a panel 200 may also have similar or identical configurations to the single segment 208 described herein.

The segment 208 construction may comprise a plurality of layers including a first substrate 304, a second substrate 316, and a third substrate 328. Each substrate may be generally planar and may have opposing first and second major surfaces. More specifically, the first substrate 304 may comprise a first major surface 308*a* and a second major surface 308*b*. Likewise, the second substrate 316 may comprise a first major surface 320*a* and a second major surface 320*b*. Finally, the third substrate 328 may comprise a first major surface 332*a* and a second major surface 332*b*.

The substrates 304, 316, and/or 328 may be constructed of any type of rigid or semi-rigid material. Suitable materials that may be used for the first and/or second substrates 304, 316 include, without limitation, plastic (e.g., PET, PTFE, PVC, etc.), ceramic, glass, metal, alloys, or combinations thereof. More specifically, the first and/or second substrates 304, 316 may comprise a thermosetting industrial laminate including a continuous filament glass cloth material with an epoxy resin binder. For example, the first and/or second substrates 304, 316 may comprise composites that are manufactured in accordance with the FR-4 and/or G-10 specification.

The first and second substrates 304, 316 may each have a cavity or opening that creates a window for the segment 208. Specifically, the first substrate may have a window that is filled with an encapsulant 312. The encapsulant 312 serves the dual purpose of protection and light conditioning. Specifically, the encapsulant 312 may be configured to protect electronics (e.g., a light source 348 and bonding wires 352*a*, 352*b*) mounted on the third substrate 328 and contained within the cavity 404. The encapsulant 312 may also be configured to condition light (e.g., diffuse, direct, and/or disperse) generated by the light source 348 as it exits the segment 208. The encapsulant 312 may also comprise optical properties for changing the color of light emitted by the light source 348 before it exits the display 204. Moreover, the encapsulant 312 may act as a lens for shaping light as it exits the display 204. In some embodiments, the encapsulant 312 may be formed of an epoxy, silicone, a hybrid of silicone and epoxy, phosphor, a hybrid of phosphor and silicone, an amorphous polyamide resin or fluorocarbon, glass, plastic, or combinations thereof.

The second substrate 316 may have a window 344 that coincides with the window of the first substrate 304 (e.g., has the same size as the window of the first substrate 304 and overlaps the window of the first substrate 304). The window 344 of the second substrate 316, however, is not filled with an epoxy, resin, or any other type of encapsulant. Rather, the window 344 of the second substrate 316 establishes a cavity 404 for housing the electronics of the segment 208.

The window of the first substrate 304 may be created by establishing a hole or via that extends from the first major surface 308*a* of the first substrate 304 to the second major surface 308*b* of the first substrate 304. Similarly, the window 344 of the second substrate 316 may be created by establishing a hole or via that extends from the first major surface 320*a* of the second substrate 316 to the second major surface 320*b* of the second substrate 316. The holes or vias may be established using any known type of manufacturing technique such as punching, etching, cutting, machining, etc.

Similar to the first and second substrates 304, 316, the third substrate 328 may correspond to a Printed Circuit Board (PCB) layer that is constructed of plastic (e.g., PET, PTFE, PVC, etc.), ceramic, glass, metal, alloys, or combinations thereof. Any suitable material known for constructing a PCB may be used for the third substrate 328. In some embodiments, the third substrate 328 may also be primarily manufactured of a composite that conforms with the FR-4 and/or G-10 manufacturing specifications.

The third substrate 328 may be configured to have electronics mounted thereto. Specifically, the third substrate 328 may comprise a plurality of electronic traces and/or bonding pads 336 on its first major surface 332*a* and its second major surface 332*b*. In some embodiments, the electronic traces and/or bonding pads 336 on the first major surface 332*a* are connected to the electronic traces and/or bonding pads 336 on the second major surface 332*b*. Specifically, vias may be established through the third substrate 328 and those vias may be filled (partially or completely) with a conductive material. These conductive vias may enable the traces and/or bonding pads 336 on opposite sides of the third substrate 328 to connect with one another.

The electronics mounted on the first major surface 323*a* of the third substrate 328 may include the light source 348 and one or more bonding wires 352*a*, 352*b* that connect the light source 348 to the traces and/or bonding pads 336. In some embodiments, the light source 348 comprises an LED that has an anode and cathode. The anode may be connected to the traces and/or bonding pads 336 via the first bonding wire 352*a* and the cathode may be connected to the traces and/or bonding pads 336 via the second bonding wire 352*b*. As can be appreciated, however, if the anode and cathode are on opposite sides of the light source 348, then one of the anode and cathode may be directly bonded to a bonding pad and the other of the anode and cathode may be connected to a different bonding pad with a bonding wire.

The light source 348, in some embodiments, comprises a single LED, a plurality of LEDs, or a specifically-configured array of LEDs. By connecting the light source 348 to two different leads, an electrical potential can be applied to the anode and cathode of the light source 348 thereby energizing the light source 348 and causing it to emit light. In some embodiments, the light source 348 is configured to emit light from its top surface (e.g., away from the third substrate 328). However, it should be appreciated that the light source 348 may be configured to emit light from its side surfaces or it may be configured to emit light toward the third substrate 328.

In some embodiments, the bonding wires 352a, 352b are made of an electrically conductive material such as Au, Ag, Cu, and the like.

Construction of the segment 208 may involve laminating or otherwise physically connecting the plurality of layers (e.g., first substrate 304, second substrate 316, and third substrate 328) to one another via known techniques. In some embodiments, adhesive layers 324, 340 may be provided between the plurality of layers to establish a semi-permanent or permanent bond between the layers.

In some embodiments, the adhesive layers 324, 340 may comprise thermosetting adhesives (e.g., a bonding film), UV-curable adhesives, or the like. In some embodiments, rather than using a thermosetting adhesive or similar type of adhesive, a pre-preg or similar type of solid adhesive layer may be utilized. Pre-preg is a term for "pre-impregnated" composite fibres. These usually take the form of a weave or are unidirectional. They already contain an amount of the matrix material used to bond them together and to other components during manufacture. Pre-pregs are commonly stored in cooled areas since activation of the pre-preg is most commonly done by heat and pressure (e.g., under lamination conditions). Accordingly, where a pre-preg is used for one or both of the adhesive layers 324, 340, a lamination and/or baking manufacturing step may be required after the requisite layers are positioned relative to one another. On the other hand, where liquid-based adhesives are used for one or both adhesive layers 324, 340, the adhesive layers may be cured without requiring a separate lamination step.

The segment 208 configuration depicted in FIGS. 3 and 4 employs an adhesive layer 324 that extends across the window 344 of the second substrate 328 and separates the encapsulant 312 in the window of the first substrate 304 from the electronics mounted to the third substrate 328. The second adhesive layer 340 is shown as having a discontinuous portion; this means that the second adhesive layer 340 may comprise either a pre-preg, bonding film, or liquid-based adhesive.

In some embodiments, the first major surface 308a of the first substrate 304 corresponds to the "top surface" of the display 204—meaning that it corresponds to the display surface of the display 204. The second major surface 308b of the first substrate 304 may be positioned proximate to the first major surface 320a of the second substrate 316 and may be bonded thereto by the first adhesive layer 324.

The second major surface 320b of the second substrate 316 may be positioned proximate to the first major surface 332a of the third substrate 328 and may be bonded thereto by the second adhesive layer 340.

The second major surface 332b of the third substrate 328 may be mounted to a larger circuit board, positioned in the housing of an electronic device incorporating the display 204. Any number of possible electronic devices (e.g., communication devices, computing devices, network devices, signage, billboards, access control devices, etc.) may incorporate the display 204 or a plurality of displays 204.

In some embodiments, the completed segment 208 commonly has a thickness of less than 3 mm. More specifically, certain embodiments may utilize a first substrate 304 having a thickness (i.e., linear distance from first major surface 308a to second major surface 308b) of less than about 1 mm and possibly as thin as about 0.6 mm. Similarly, the second substrate 316 may have a thickness (i.e., linear distance from first major surface 320a to second major surface 320b) of less than about 1 mm and possibly as thin as about 0.5 mm. The third substrate 328 may have a thickness (i.e., linear distance from first major surface 332a to second major surface 332b) of less than about 1 mm and possibly as thin as about 0.1 mm. The thickness of the adhesive layers 324, 340 is generally negligible (e.g., on the order of microns or less) in relation to the thickness of the substrate layers.

Figure 5:
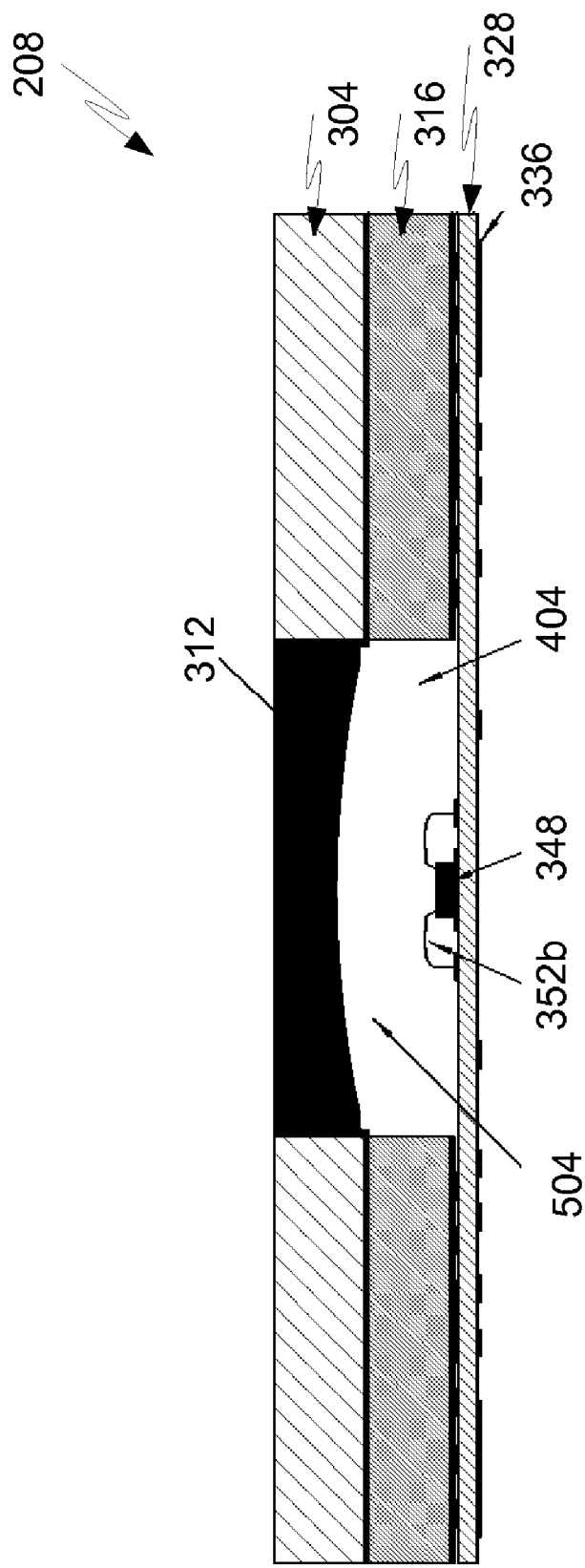
FIG. 5 is a cross-sectional view of a second display segment configuration in accordance with embodiments of the present disclosure.

FIG. 5 depicts an alternative configuration of a segment 208. The segment 208 depicted in FIG. 5 is similar to the segment 208 of FIGS. 3 and 4. The difference between the segment configuration of FIG. 5 and that of FIGS. 3 and 4 is that the first adhesive layer 324 has a gap 504 across the cavity 404. Here, the first adhesive layer 324 may comprise a dry type of adhesive that is drilled or punched with an opening window for the segment 208. Alternatively, the first adhesive layer 324 may comprise a layer of a screen-printed wet adhesive. The adhesive gap 504 may span the entirety of the cavity 404. More specifically, the dimensions of the adhesive gap 504 may coincide with the dimensions of the window in the first substrate 304 and the dimensions of the window 344 in the second substrate 316. The adhesive gap 504 enables light emitted by the light source 348 to travel directly to the encapsulant 312 without traversing any material or medium other than air or a gas that is trapped within the cavity 404.

Figure 6:
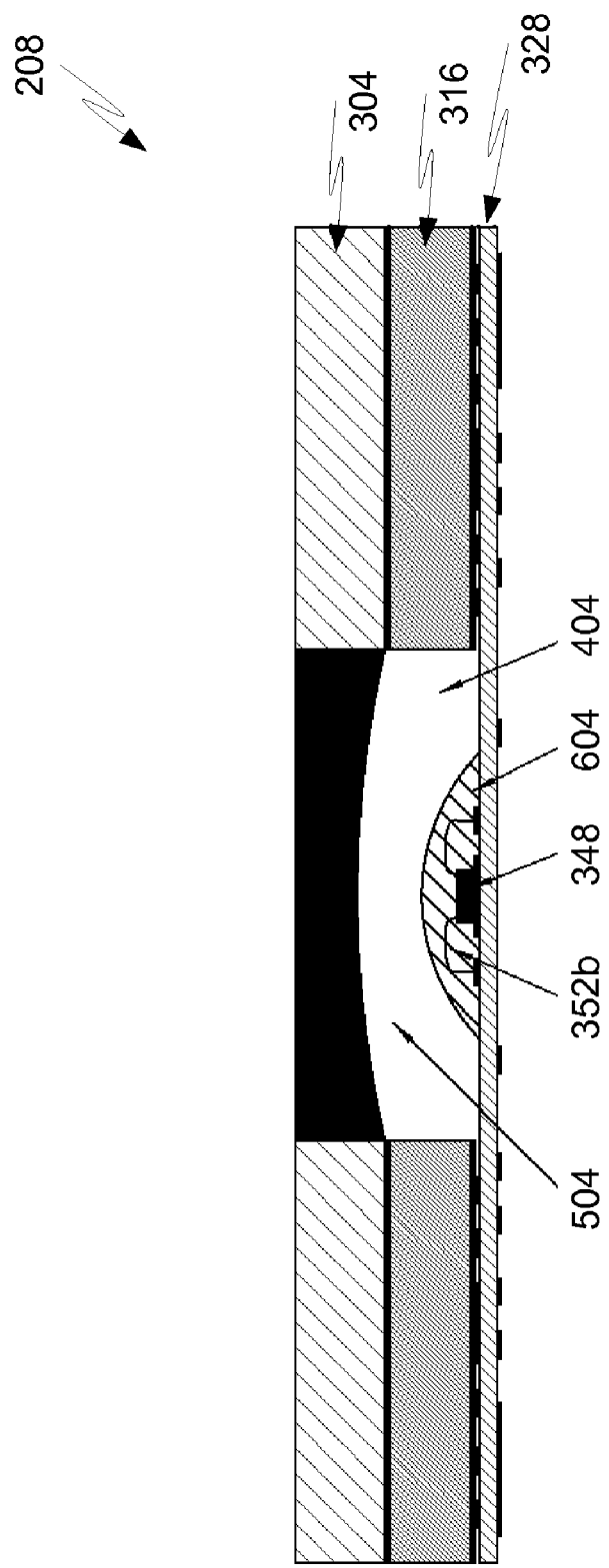
FIG. 6 is a cross-sectional view of a third display segment configuration in accordance with embodiments of the present disclosure.

FIG. 6 depicts yet another alternative configuration of segment 208. The segment depicted in FIG. 6 is similar to the segment 208 of FIG. 5. The segment 208 of FIG. 6, however, includes a protective encapsulant 604 that surrounds and protects the light source 348 and bonding wires 352a, 352b. In some embodiments, the protective encapsulant 604 may comprise epoxy, silicone, a hybrid of silicone and epoxy, phosphor, a hybrid of phosphor and silicone, an amorphous polyamide resin or fluorocarbon, glass, plastic, or combinations thereof. The protective encapsulant 604 is primarily responsible for providing structural protection to the bonding wire(s) 352a, 352b. As can be appreciated, however, the protective encapsulant 604 is not generally necessary as a protective measure against ambient moisture because the cavity 404 is hermetically sealed by the encapsulant 312, the third substrate 328, and the walls of the second substrate 316 that define the cavity 404. Accordingly, the addition of the protective encapsulant 604 may be considered an optional addition.

It should be appreciated that while the protective encapsulant 604 is only depicted in the segment 208 configuration having an adhesive gap 504, the protective encapsulant 604 may also be employed in the segment 208 configuration depicted in FIGS. 3 and 4.

With reference now to FIGS. 7A-D a process of preparing the first substrate 304 will be described in accordance with embodiments of the present disclosure. In a first processing stage, the first substrate 304 comprises an encapsulant window 704. Each segment 208 for a display 204 may have similar or identical encapsulant windows 704. As can be appreciated, if a panel 200 is being manufactured with a plurality of displays 204, then a plurality of windows 704 for all segments 208 may be established in the material of the first substrate 304.

Figure 7A:
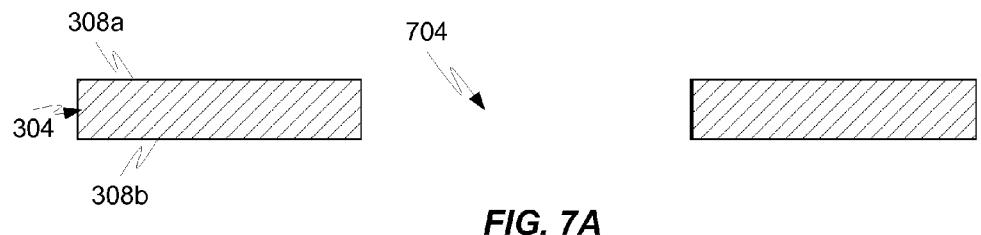
FIG. 7A is a cross-sectional view of a first substrate in a first stage of manufacture in accordance with embodiments of the present disclosure.
Figure 7B:
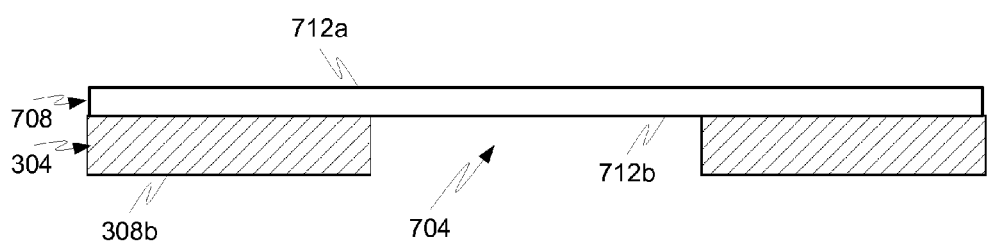
FIG. 7B is a cross-sectional view of a first substrate in a second stage of manufacture in accordance with embodiments of the present disclosure.

In a second processing stage depicted in FIG. 7B, a temporary layer 708 is placed adjacent to the first substrate 304. More specifically, a second major surface 712b of the temporary layer 708 is abutted to the first major surface 308a of the first substrate 304. The opposing first major surface 712a of the temporary layer 708 may then be laid on a processing or work surface to support the first substrate 304. In other words, after the temporary layer 708 has been placed next to the first substrate 304, the two layers may be flipped over and laid on the work surface for the next processing stage. However, this flipped orientation is not depicted in FIGS. 7C-D for ease of understanding.

Figure 7C:
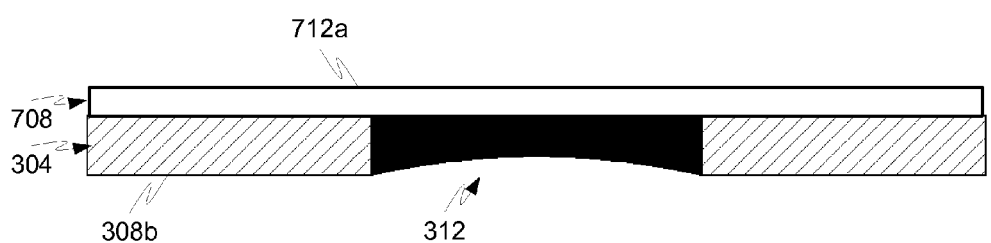
FIG. 7C is a cross-sectional view of a first substrate in a third stage of manufacture in accordance with embodiments of the present disclosure.
Figure 7D:
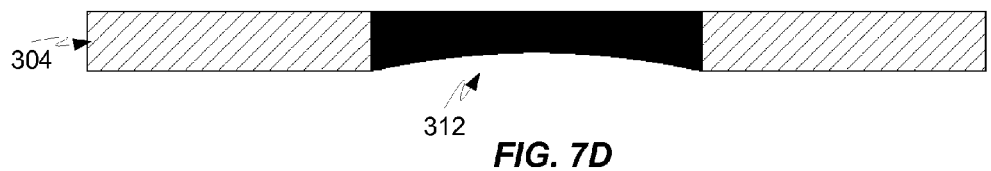
FIG. 7D is a cross-sectional view of a first substrate in a fourth stage of manufacture in accordance with embodiments of the present disclosure.

As can be seen in FIG. 7C, the encapsulant window 704 may be filled with the encapsulant 312. In some embodiments, all encapsulant windows 704 on the first substrate 304 corresponding to all segments 208 of the panel 200 may be filled substantially simultaneously (e.g., simultaneously within a machine and processing delay tolerance). In the prior art it was required that the encapsulant be provided by an injection filling process. In accordance with embodiments of the present disclosure, however, the encapsulant material may be deposited via a screen printing process. This particular process may be a quicker and more efficient manner of filling the encapsulant windows 704 with the encapsulant 312. In this processing stage, any excess encapsulant material that is outside the encapsulant window 704 or on the second major surface 308b of the first substrate 304 may be removed by a scraping process. It should also be noted that the encapsulant 312 develops a convex feature on the side of the second major surface 308b. This convex feature may be inherently created during the application of the encapsulant 312 or during the step where excess material is removed from the first substrate 304. In any event, the convex feature may help to direct light as it exits the segment 208.

Following the application of encapsulant 312 and the removal of any excess encapsulant material, the temporary layer 708 may be removed from the first substrate 304 and the first substrate 304 may be considered ready for combining with the other substrates 316, 328.

Figure 8:
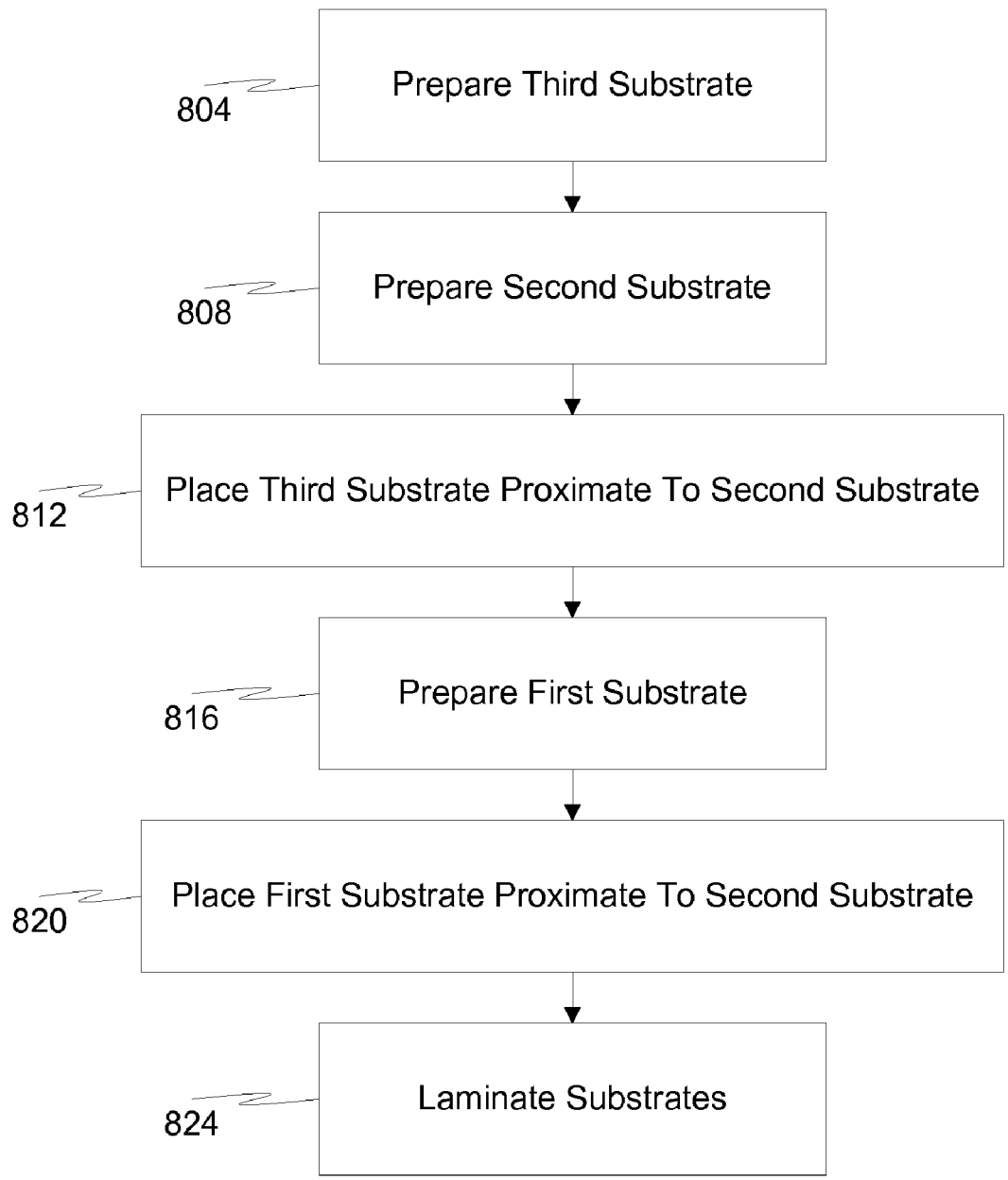
FIG. 8 is a flow chart depicting a display manufacturing method in accordance with embodiments of the present disclosure.

With reference now to FIG. 8, a method of manufacturing a display 204 or a plurality of displays 204 on a single panel 200 will be described in accordance with embodiments of the present disclosure. The method begins with the preparation of the third substrate 328 (step 804). The third substrate 328 may be a pre-manufactured PCB, a custom-manufactured PCB, or a semi-customer PCB. The third substrate 328 may be manufactured according to any known techniques. The electronics (e.g., light source 348 and bonding wires 352a, 352b may also be attached to the third substrate 328 in this step. Any other necessary electronics may also be attached (e.g., soldered) to either surface of the third substrate 328.

Following preparation of the third substrate 328 (or in parallel with the preparation of the third substrate 328), the second substrate 316 is also prepared (step 808). Preparing the third substrate 316 may involve obtaining the necessary material for the second substrate 316 and establishing the opening windows 344 for each segment 208. If a plurality of segments 308 and/or display 304 are being prepared simultaneously, then a plurality of opening windows 344 may be established at predetermined points along the second substrate 316. It should be appreciated that the entity which prepares the third substrate 328 does not necessarily have to prepare the second substrate 316. Rather, different entities may prepare the respective substrates and provide the pre-manufactured substrates to a different entity that is responsible for manufacturing the displays 204.

After the third 328 and second 316 substrates have been prepared, the two substrates may be placed proximate to one another (step 812). More specifically, the second major surface 320b of the second substrate 316 may be placed proximate to the first major surface 332a of the third substrate 328 and the opening windows 344 may be positioned to surround the electronics mounted on the first major surface 332a of the third substrate 328. A second adhesive layer 340 may also be placed between the two substrates. Following step 812, an optional first lamination step may be performed to attach the second substrate 316 to the third substrate 328.

Thereafter, the first substrate 304 is prepared (step 816). Details of the process used to prepare the first substrate 304 were described in relation to FIGS. 7A-D. Once prepared, the first substrate 304 is placed proximate to the second substrate 316 (step 820). More specifically, the second major surface 308b of the first substrate 304 is placed proximate to the first major surface 320a of the second substrate 316 and a first adhesive layer 324 may be provided therebetween. Furthermore, the encapsulants 312 in the windows of the first substrate 304 may be aligned with the opening windows 344 of the second substrate 316.

It should also be appreciated that the entity which prepares the first substrate 304 does not necessarily have to be the same entity which prepared the second substrate 316 or third substrate 328.

After the first substrate 304 is positioned accurately relative to the second substrate 316, the substrates may be subjected to pressure and/or heat to activate the adhesive layers 324, 340 and laminate the substrates together (step 824). In some embodiments, the lamination step 824 may be the only lamination step performed. In some embodiments, the lamination step 824 may be the second lamination step performed as the second and third substrates may already have been laminated together.

Following the lamination step, the displays 204 may be individually cut from the panel 200 for distribution or they may be sold in panel form. Alternatively, groups of displays 204 may be cut from the panel and sold as groups.

Specific details were given in the description to provide a thorough understanding of the embodiments. However, it will be understood by one of ordinary skill in the art that the embodiments may be practiced without these specific details. For example, circuits may be shown in block diagrams in order not to obscure the embodiments in unnecessary detail. In other instances, well-known circuits, processes, algorithms, structures, and techniques may be shown without unnecessary detail in order to avoid obscuring the embodiments.

While illustrative embodiments of the disclosure have been described in detail herein, it is to be understood that the inventive concepts may be otherwise variously embodied and employed, and that the appended claims are intended to be construed to include such variations, except as limited by the prior art.

What is claimed is:

1. A display assembly, comprising:
one or more display segments, the one or more display segments comprising:
a light source mounted on a first major surface of a third substrate and configured to generate and emit light away from the third substrate;
a second substrate comprising a first major surface and a second major surface, the second substrate having an opening window that extends from its first major to its second major surface, wherein the opening window is configured to surround the light source, and wherein the second major surface of the second substrate is positioned proximate to the first major surface of the third substrate;
a first substrate comprising a first major surface and a second major surface, the first substrate having an opening window that extends from its first major surface to its second major surface, wherein the opening window of the first substrate is positioned to coincide with the opening window of the second substrate such that light emitted by the light source passes through the opening windows of both the first substrate and the second substrate, and wherein the second major surface of the first substrate is positioned proximate to the first major surface of the second substrate.

2. The display assembly of claim 1, wherein the opening window of the first substrate is filled with an encapsulant.

3. The display assembly of claim 2, wherein the encapsulant comprises at least one of epoxy, silicone, a hybrid of silicone and epoxy, phosphor, a hybrid of phosphor and silicone, an amorphous polyamide resin or fluorocarbon, glass, and plastic.

4. The display assembly of claim 3, wherein the encapsulant hermetically seals the light source within a cavity created by the opening window of the second substrate.

5. The display assembly of claim 4, wherein the light source comprises an LED and wherein light generated by the light source travels directly from the LED to the encapsulant without traversing any material.

6. The display assembly of claim 1, wherein the third substrate comprises a Printed Circuit Board and wherein the first and second substrates are manufactured according to at least one of the FR-4 and G-10 specification.

7. The display assembly of claim 6, wherein the combined thickness of the first, second, and third substrates is less than 3 mm.

8. The display assembly of claim 1, wherein a first adhesive layer bonds the first substrate to the second substrate and wherein a second adhesive layer bonds the second substrate to the third substrate.

9. The display assembly of claim 8, wherein the first and second adhesive layers comprise one or more of a bonding film, a UV-curable adhesive, a pre-preg, and a liquid adhesive.

10. The display assembly of claim 8, wherein the first adhesive layer extends across and separates the opening windows of the first and second substrates.

11. The display assembly of claim 8, wherein the first adhesive layer does not extend across the opening windows of the first and second substrates.

12. The display assembly of claim 1, further comprising a protective encapsulant that surrounds and protects the light source and a bonding wire that electrically connects the light source to the third substrate.

13. A multi-segment display, comprising:
a plurality of segments, at least one of the plurality of segments comprising:
a first substrate, a second substrate, and a third substrate, wherein the first and second substrates each comprise opening windows, wherein the opening window of the first substrate is filled with an encapsulant, wherein the opening window of the second substrate is empty, and wherein the first substrate, second substrate, and third substrate are bonded to one another such that a hermetically-sealed cavity is created between the third substrate, the encapsulant, and walls of the second substrate that surround the opening window of the second substrate.

14. The display of claim 13, wherein a light source is mounted on the third substrate within the hermetically-sealed cavity.

15. The display of claim 14, wherein the light source is exposed to gases contained within the cavity.

16. The display of claim 13, wherein the third substrate comprises a plurality of electrical bonding pads and traces on a first major surface and an opposing second major surface.

17. The display of claim 13, wherein the encapsulant is configured to hermetically seal the cavity as well as condition light generated by a light source contained within the cavity before the light exits the display.

18. A panel comprising the display of claim 13.

19. A panel of multi-segment displays, comprising:
a first substrate, a second substrate, and a third substrate, wherein the first and second substrates each comprise a plurality of opening windows, wherein the opening windows of the first substrate are filled with an encapsulant, wherein the opening windows of the second substrate are empty, and wherein the first substrate, second substrate, and third substrate are bonded to one another such that a plurality of hermetically-sealed cavities are created between the third substrate, the encapsulant, and walls of the second substrate that surround the opening windows of the second substrate.

20. The panel of claim 19, wherein each cavity comprises a light source therein which is mounted to the third substrate.

* * * * *